US006242918B1

United States Patent
Miller et al.

(10) Patent No.: US 6,242,918 B1
(45) Date of Patent: Jun. 5, 2001

(54) APPARATUS AND METHOD FOR REDUCING THE RECOVERY PERIOD OF A PROBE IN PULSED NUCLEAR QUADRUPOLE RESONANCE AND NUCLEAR MAGNETIC RESONANCE DETECTION SYSTEMS BY VARYING THE IMPEDANCE OF A LOAD TO REDUCE TOTAL Q FACTOR

(75) Inventors: Joel B. Miller, Cheverly, MD (US); Kenneth J. McGrath, Manassas, VA (US); Mark A. Hepp, Accokeek, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 08/751,201

(22) Filed: Nov. 15, 1996

(51) Int. Cl.⁷ ........................................ G01V 3/00
(52) U.S. Cl. ........................... 324/322; 324/318
(58) Field of Search .................. 324/318, 322; 455/78, 79, 80, 82, 83

(56) References Cited

U.S. PATENT DOCUMENTS 5,172,061 * 12/1992 Crooks et al. ..................... 324/322

OTHER PUBLICATIONS

Garroway et al.,"Improved Recovery Time in Single Coil Pulsed NMR Spectrometers," Rev. Sci. Instum., vol. 46, No. 10, pp. 1342–1343, Oct. 1975.*

Kisman et al., "Coupling Scheme and Probe Damper for Pulsed Nuclear Magnetic Resonance Single Coli Probe," Rev. Sci. Instum., vol. 45, No. 9, pp. 1159–63, Aug. 1974.*

* cited by examiner

Primary Examiner—Louis M. Arana
(74) Attorney, Agent, or Firm—Thomas E. McDonnell; John Karasek

(57) ABSTRACT

A nuclear quadrupole resonance (NQR) or nuclear magnetic resonance (NMR) apparatus which includes a probe and a variable impedance spectrometer. The probe emits a signal towards a specimen which causes the specimen to produce a resonance signal. After a recovery period from emitting the signal, the probe receives the resonance signal produced by the specimen. The variable impedance spectrometer is connected to the probe and has a total Q factor therewith. The spectrometer causes the total Q factor during the recovery period to be lower than the total Q factor before and after the recovery period by varying the impedance of the spectrometer, without changing the electrical configuration of the probe.

13 Claims, 9 Drawing Sheets

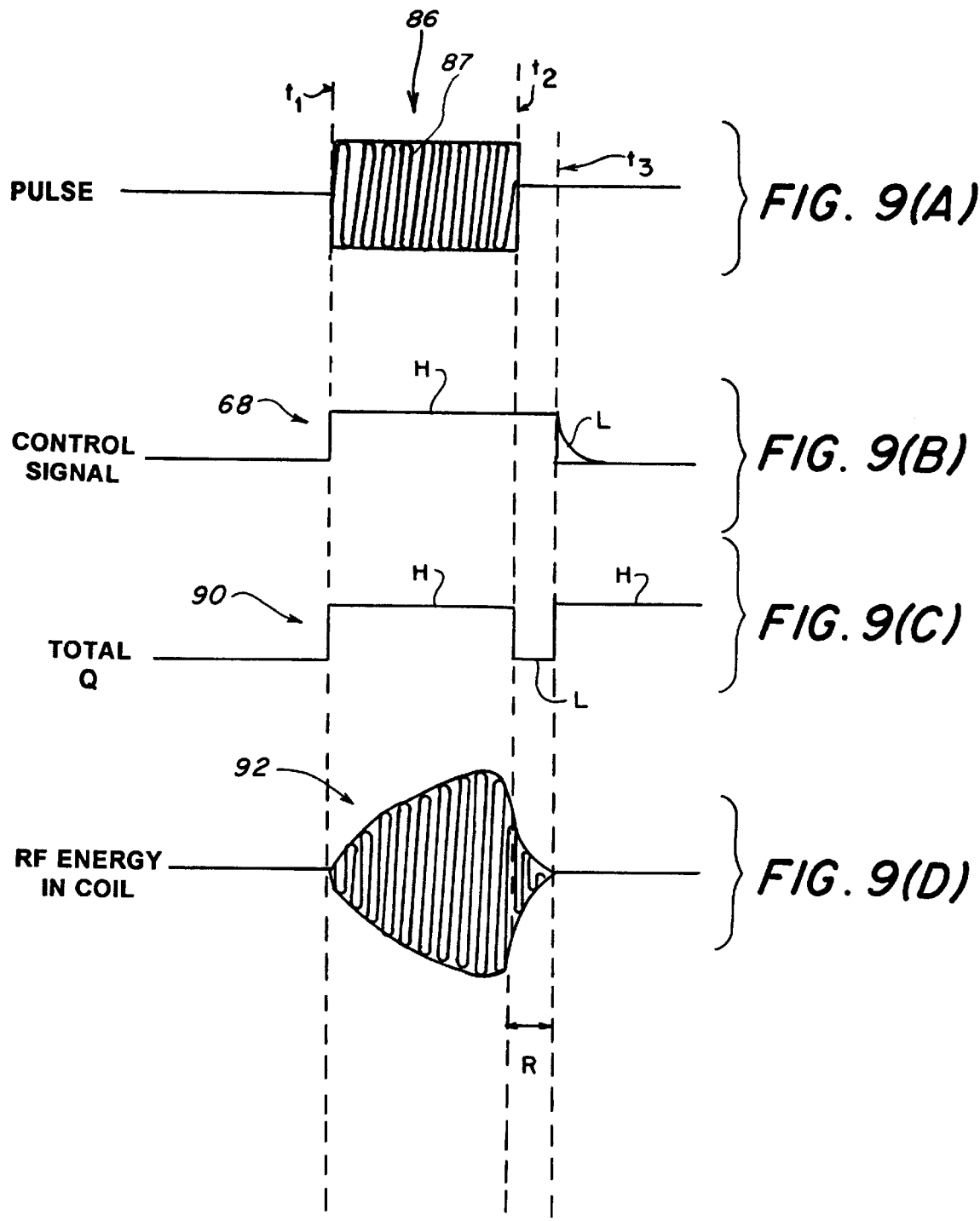

APPARATUS AND METHOD FOR REDUCING THE RECOVERY PERIOD OF A PROBE IN PULSED NUCLEAR QUADRUPOLE RESONANCE AND NUCLEAR MAGNETIC RESONANCE DETECTION SYSTEMS BY VARYING THE IMPEDANCE OF A LOAD TO REDUCE TOTAL Q FACTOR

BACKGROUND OF THE INVENTION

1. Field of the Invention

The present invention relates to an apparatus and method for reducing the recovery period of a probe in nuclear quadrupole resonance (NQR) and nuclear magnetic resonance (NMR) detection systems, and, more particularly, to an apparatus and method for reducing the recovery period by varying the impedance of a load to lower the total Q factor of the probe and load during the recovery period as compared to the total Q factor during transmission and reception.

2. Description of the Related Art

There are many situations where it is desirable to detect the presence of a specific substance. For example, with the unfortunate increase in drug trafficking and terrorist use of high explosives in aircraft and buildings, there is a strong interest for a reliable detection system that can detect sub-kilogram quantities of narcotics and explosives against a background of more benign materials in a rapid, accurate, and non-invasive fashion.

Nuclear quadrupole resonance (NQR) and nuclear magnetic resonance (NMR) are known techniques for detecting the presence of specific substances. More specifically, various substances produce a magnetic resonance signal when excited by radio frequency (RF) radiation at a particular frequency. Generally, RF radiation at a particular frequency will cause a precession of nuclei in a specific substance, but not in other substances. Nuclear quadrupole resonance (NQR) and nuclear magnetic resonance (NMR) take advantage of this phenomenon to detect the various substances (for NMR a magnet is included but not illustrated).

FIG. 1 illustrates a conventional NQR and NMR apparatus. As illustrated in FIG. 1, a transmitter 20 and a receiver 22 are connected to a probe 24 through a transmit/receive (T/R) switch 26. Probe 24 includes a coil (not illustrated) forming part of a resonant circuit (not illustrated). To detect the presence of a specific substance, T/R switch 26 connects transmitter 20 to probe 24 while disconnecting receiver 22 from probe 24. Then, transmitter 20 generates a pulse and supplies the pulse to probe 24. Generally, the pulse is formed from a signal having a frequency corresponding to the resonance frequency of the nuclei of the specific substance that is intended to be detected. The pulse is transmitted to probe 24, which causes the coil in probe 24 to store RF energy and generate an RF magnetic field at a target specimen (not illustrated). If the specific substance desired to be detected is present in the target specimen, the RF magnetic field generated by the coil will excite nuclear resonance in the quadrupolar nuclei of the specific substance and thereby cause the specific substance to produce a resonance signal.

After the RF magnetic field is generated by the coil of probe 24, the T/R switch 26 connects receiver 22 to probe 24 while disconnecting transmitter 20 from probe 24. The coil in probe 24 then detects the resonance signal produced by the specific substance, and probe 24 produces a corresponding output signal. The output signal of probe 24 is received and analyzed by receiver 22, to confirm the presence of the specific substance in the target specimen.

Therefore, probe 24 generates an RF magnetic field at a specimen, and also receives resonance signals produced by the specific substance in the specimen. However, probe 24 cannot receive the resonance signal immediately after generating an RF magnetic field, because of the stored RF energy in the probe. Instead, immediately after the excitation pulse, probe 24 must "ring down", i.e., dissipate the stored RF energy, before it can usefully receive the resonance signal.

FIG. 2(A) illustrates a pulse 25 produced by transmitter 20 and provided to the coil of probe 24 from time $t_1$ to $t_2$, and FIG. 2(B) illustrates the corresponding RF energy 27 stored in the coil. As illustrated by FIGS. 2(A) and 2(B), some RF energy still remains in the coil after the end of pulse 25 at time $t_2$ until time $t_3$. This remaining RF energy must be dissipated, that is, probe 24 must "ring down", before probe 24 can effectively be used to receive a resonance signal. The time required for probe 24 to "ring down" to an appropriate level is referred to as a "recovery period", and is illustrated in FIG. 2(B) as recovery period R.

Unfortunately, a long recovery period will undesireably decrease the detection sensitivity of probe 24, because of the loss of the resonance signal. For example, if the lifetime of a resonance signal is shorter than, or comparable to, the recovery period of the probe, then the resonance signal will have decayed substantially before it can be detected.

For a single coil employed in probe 24, a rough rule of thumb is that a useful resonance signal cannot be received by probe 24 until approximately twenty (20) time constants have elapsed from the end of the RF pulse provided to the coil of probe 24. The time constant of the coil is given by $Q/\pi f$, where f is the resonance frequency (in Hz), and Q is the quality factor of the coil. Therefore, the recovery period typically must be at least $20Q/\pi f$. This recovery period becomes particularly long with NQR and NMR operating at relatively low frequencies, such as at frequencies less than 10 MHz and for high-Q coils.

Moreover, the signal-to-noise ratio (SNR) of a resonance signal received by the coil is increased when the coil has a high Q. Therefore, it is desirable to have a coil with a high Q. However, as can be seen from the time constant $Q/\pi f$, the recovery period can be relatively long for high Q coils. As a result, using the prior art, a system designer must compromise between the desire to have a high Q coil, and the desire to reduce the recovery period. For example, a coil with a Q of 1,000 at a frequency of 1 MHz has an estimated recovery period of 6 ms. This recovery period is too long to reliably detect many substances, and the Q of the coil may have to be reduced.

In addition, in NQR and NMR, a train of sequential pulses is typically generated by transmitter 20 and supplied to probe 24 for generating a series of RF magnetic fields at a specimen. After each pulse is provided to the coil in probe 24 and the corresponding RF magnetic field is generated, probe 24 must wait for a respective recovery period to elapse. After the recovery period elapses, probe 24 can receive resonance signals. Further, after a period of time elapses for receiving resonance signals, the next pulse is generated. Therefore, a recovery period must pass between each pulse. This recovery period dictates the time scale for which the train of RF pulses can be applied.

For example, in a conventional steady-state free-precession sequence of RF pulses, the pulses are spaced at a time interval τ. Under certain conditions, it is observed that the amplitude of the resonance signal received in each time interval τ desirably increases as the time interval τ decreases. Moreover, a resonance signal produced by a specimen can be sampled more frequently by decreasing the time interval τ, thereby increasing the overall signal-to-noise ratio (SNR). In addition, for methods employing stochastic excitation, the excitation bandwidth is limited by the time interval τ. Therefore, a relatively short time interval τ is generally preferred. Unfortunately, a long recovery period in the probe necessarily increases τ.

Conventional methods have been used to "actively damp" the probe, and thereby reduce the recovery period. For example, the recovery period can be actively damped by switching the total Q factor back and forth from a high total Q factor to a low total Q factor, where the total Q factor is switched low during the recovery period. This low total Q factor during the recovery period reduces the recovery period. However, such methods modify the circuitry of the probe to switch the total Q factor. In other words, the electrical configuration of the probe is changed to switch the total Q factor. Such changing of the electrical configuration of the probe can result in a loss of detection sensitivity of the probe.

Moreover, conventional active damping methods generally induce switching transients which cause the resonant circuit of the probe to ring anew. Also, resistive elements in the probe or the active damping circuitry can reduce the signal-to-noise ratio. In addition, some conventional active damping methods are too complex for general use and generally require a system operator to balance several bridge circuits, or balance positive and negative voltage limiters on amplifier feedback circuits. Such circuitry does not provide the efficiency and reliability required for most commercial applications.

SUMMARY OF THE INVENTION

Accordingly, it is an object of the present invention to provide a method and apparatus which reduces the recovery period of a probe by changing the total Q factor of the probe to a low total Q factor during the recover period, without modifying the electrical configuration of the probe.

It is an additional object of the present invention to provide a method and apparatus which reduces the recovery period of a probe by changing the impedance of a load connected to the probe to change the total Q factor to a low total Q factor during the recovery period, wherein the probe has a fixed electrical configuration which is not modified to change the total Q factor.

Additional objects and advantages of the invention will be set forth in part in the description which follows, and, in part, will be obvious from the description, or may be learned by practice of the invention.

The foregoing objects of the present invention are achieved by providing an NQR or NMR apparatus which includes a probe and a variable impedance load. The probe generates an RF magnetic field at a specimen which causes the specimen to produce a resonance signal. During and after a recovery period, the probe receives the resonance signal produced by the specimen. The variable impedance load is connected to the probe and has a total Q factor therewith. The total Q factor during the recovery period is made to be lower than the total Q factor before and after the recovery period by varying the impedance of the load, without changing the electrical configuration of the probe.

Objects of the present invention are also achieved by providing a method for generating an RF magnetic field by a probe and detecting a resonance signal produced by a specimen in response to the RF magnetic field. The probe has a variable impedance load connected thereto. The method includes the steps of (a) generating an RF magnetic field in the probe at a specimen to cause the specimen to produce a resonance signal; (b) waiting for a recovery period to elapse after generating the RF magnetic field; (c) causing a total Q factor of the probe and the load during the recovery period to be lower than the total Q factor before and after the recovery period by varying the impedance of the load, without changing the electrical configuration of the probe; and (d) receiving the resonance signal with the probe.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 9(A), 9(B), 9(C) and 9(D) are diagrams illustrating a pulse produced by a transmitter as illustrated in FIG. 3, a control signal produced by a control unit as illustrated in FIG. 3, the total Q factor of the apparatus illustrated in FIG. 3, and the RF energy stored in a coil of a probe as illustrated in FIG. 3, respectively, according embodiments of the present invention.

DESCRIPTION OF THE PREFERRED EMBODIMENTS

Figure 1:
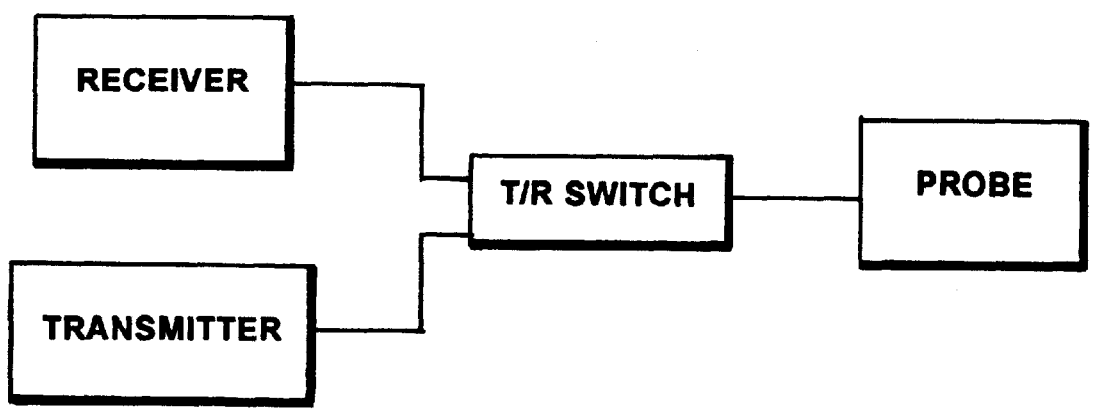
FIG. 1 (prior art) is a block diagram illustrating a conventional NQR or NMR apparatus for generating an RF magnetic field at a specimen and detecting a resonance signal produced by the specimen in response to the generated field.
Figure 2:
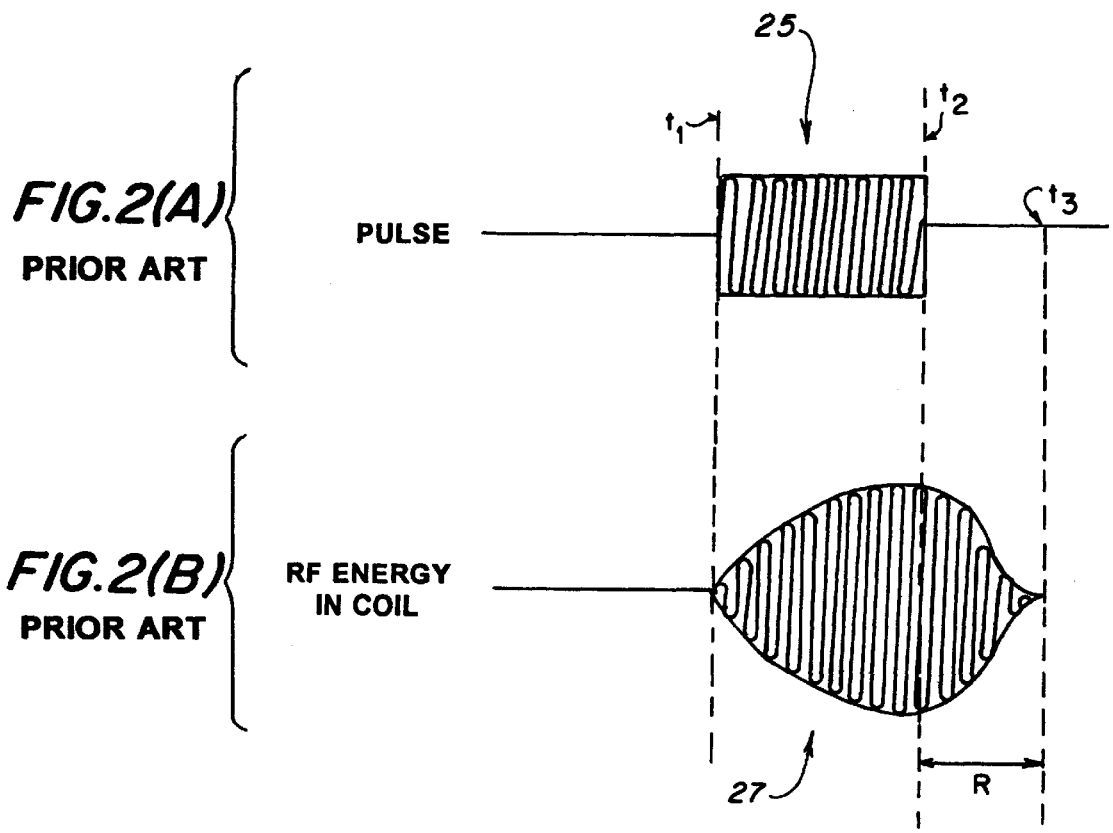
FIG. 2(A) (prior art) is a diagram illustrating a pulse produced by a transmitter, and FIG. 2(B) (prior art) is a diagram illustrating the corresponding RF energy stored in a coil of probe.

Reference will now be made in detail to the present preferred embodiments of the present invention, examples of which are illustrated in the accompanying drawings, wherein like reference numerals refer to like elements throughout.

Figure 3:
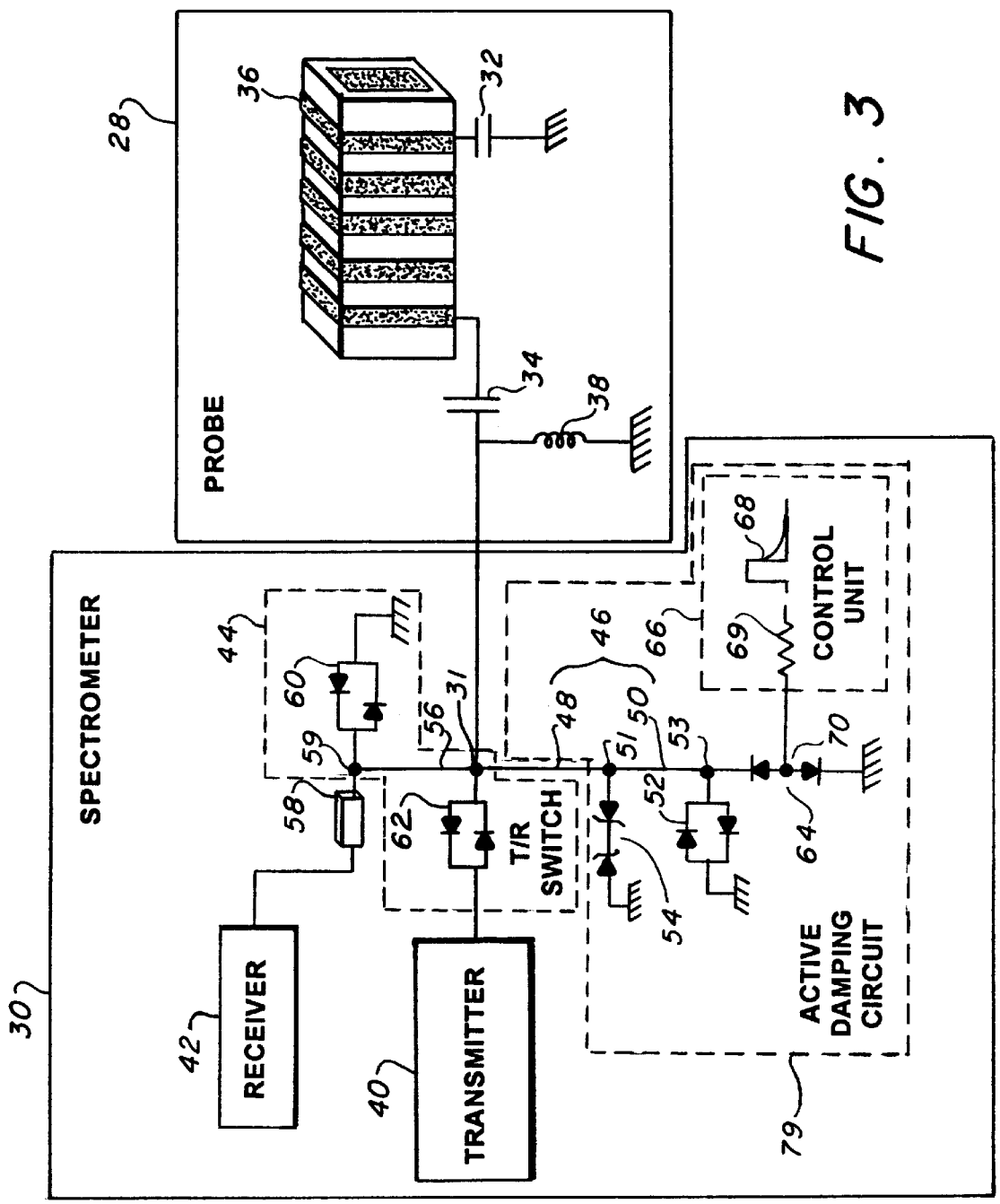
FIG. 3 is a block diagram illustrating an NQR or NMR apparatus for generating an RF magnetic field at a specimen and detecting a resonance signal produced by the specimen in response to the generated field, according to an embodiment of the present invention.

FIG. 3 is a block diagram illustrating an NQR or NMR apparatus for generating an RF magnetic field at a specimen and detecting a resonance signal produced by the specimen in response to the generated RF magnetic field, according to an embodiment of the present invention.

Referring now to FIG. 3, a conventional probe 28 is connected to a spectrometer 30 at a connection point 31. Probe 28 includes a coil 36, a capacitor 32, a capacitor 34, and a coil 38. Preferably, probe 28 has an impedance of approximately 50 ohms (50 $\Omega$ is a typical nominal value, skilled practitioners will recognize that this may be varied, with corresponding changes to other values). Coil 36 should be capacitively tuned to a frequency of interest, and capable of efficiently converting RF power to a magnetic field that excites the nuclear spins in a specific substance which is desired to be detected.

Spectrometer 30 includes a conventional RF transmitter 40 and a conventional receiver 42 connected to probe 28 via a T/R switch 44. Receiver 42 is connected to T/R switch 44 via preamplifier 58. Preferably, transmitter 40 has an output impedance of approximately 50 $\Omega$ and preamplifier 58 has an input impedance of approximately 50 $\Omega$, to match the 50 $\Omega$ impedance of probe 28. A half-wave ($\lambda/2$) transmission line 46 is connected to T/R switch 44 at connection point 31, in parallel with probe 28, receiver 42 and transmitter 40. $\lambda/2$ transmission line 46 is formed by two (2) separate $\lambda/4$ transmission lines 48 and 50 connected together in series at a connection point 51. One end of $\lambda/4$ transmission line 50 is connected to ground through two (2) 0.7V crossed switching diodes 52. The other end of $\lambda/4$ transmission line 50 is connected to ground through two (2) opposing Zener diodes 54 with values of 15V or greater, connected in series. Diodes 54 are connected to $\lambda/4$ transmission line 50 at a connection point 51, and diodes 52 are connected to $\lambda/4$ transmission line 50 at a connection point 53. Switched PIN diodes could be used as diodes 54, instead of Zener diodes.

A $\lambda/4$ transmission line 56 has one end connected to a preamplifier 58 at a connection point 59, and the other end connected to connection point 31. Two (2) crossed 0.7V switching diodes 60 connect to one end of $\lambda/4$ transmission line 56 at connection point 59 to ground. Two (2) crossed 0.7V switching diodes 62 connect transmitter 40 to connection point 31. As illustrated in FIG. 3, T/R switch 44 includes $\lambda/4$ transmission line 56 and diodes 60 and 62.

One end of $\lambda/4$ transmission line 50 is connected to ground via opposing diodes 64 connected in series and having a connection point 70 therebetween. A control unit 66 produces a control signal 68 and provides the control signal at connection point 70. Control unit 66 has an output impedance 69 which is a very small value, typically on the order of 3 $\Omega$. Control signal 68 is essentially used to provide a switchable, low-impedance path to ground from the probe 28. $\lambda/2$ transmission line 46, diodes 52, 54 and 70, and control unit 66 can collectively be referred to as an active damping circuit 79 which is connected to T/R switch 44.

Figure 4:
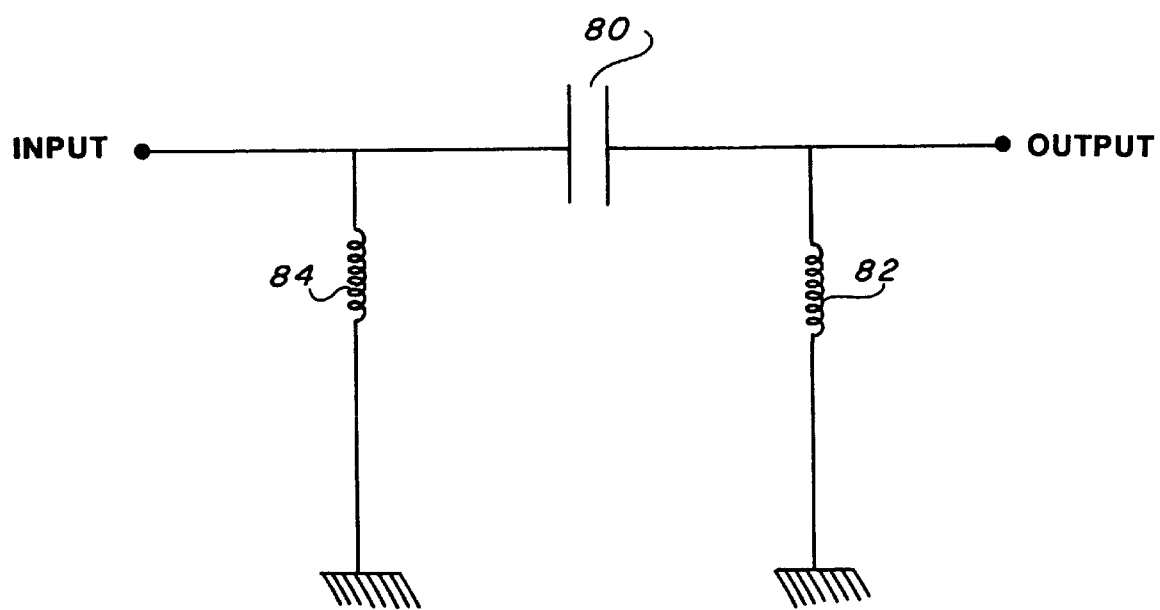
FIG. 4 is a diagram illustrating the configuration of a quarter-wave (λ/4) transmission line constructed from discrete elements as used in the apparatus of FIG. 3, according to an embodiment of the present invention.

To fully understand the operation of the apparatus illustrated in FIG. 3, the operation of a $\lambda/4$ transmission line, such as $\lambda/4$ transmission lines 48, 50 and 56, should be understood. FIG. 4 is a diagram illustrating a Π network which is equivalent to a $\lambda/4$ transmission line. As illustrated in FIG. 4, a $\lambda/4$ transmission line has the discrete element equivalent of a capacitor 80 and inductors 82 and 84. The discrete element equivalent of a $\lambda/4$ transmission line, as illustrated in FIG. 4, is essentially a highpass RF filter section tuned to behave like a $\lambda/4$ transmission line at a resonant frequency.

Generally, if one end of a $\lambda/4$ transmission line is at a relatively high impedance, the $\lambda/4$ transmission line transforms the high impedance to a relatively low impedance as seen from the other end of the $\lambda/4$ transmission line. Conversely, if one end of $\lambda/4$ transmission line is at a relatively low impedance, the $\lambda/4$ transmission line transforms the low impedance to a relatively high impedance as seen from the other end of the $\lambda/4$ transmission line. By contrast, a $\lambda/2$ transmission line (such as $\lambda/2$ transmission line 46) will cause a high impedance at one end of the $\lambda/2$ transmission line to be seen as a high impedance from the other end of the $\lambda/2$ transmission line, and will cause a low impedance at one end of the $\lambda/2$ transmission line to be seen as a low impedance from the other end of the $\lambda/2$ transmission line.

Moreover, as can be seen from FIG. 3, probe 28 is connected to spectrometer 30. Therefore, probe 28 in combination with spectrometer 30 will have a total Q factor which is dependent on the electrical configuration of probe 28 and spectrometer 30 at a particular time. More specifically, spectrometer 30 forms a variable-impedance load where the total Q factor of probe 28 in combination with spectrometer 30 will depend on the impedance of spectrometer 30. For example, when the impedance of spectrometer 30 is matched to probe 28 (for example, when the impedance of spectrometer 30 is approximately 50 $\Omega$), the total Q factor of probe 28 in combination with spectrometer 30 will be high. Similarly, when the impedance of spectrometer 30 is relatively low (for example, when the impedance of spectrometer 30 is significantly lower than 50 $\Omega$. Such as closer to the 3 $\Omega$ output impedance 69 of control unit 66), the total Q factor of probe 28 in combination with spectrometer 30 will be low. Moreover, it is desirable to have a high total Q factor during transmission of a pulse from transmitter 40 to probe 28, to efficiently transfer the pulse from transmitter 40 to probe 28. Similarly, it is desirable to have a high total Q factor during reception of a resonance signal by probe 28, to efficiently receive the resonance signal. By contrast, it is desirable to have a low total Q factor during the recovery period, to rapidly dissipate the energy stored in the coil.

Therefore, as described in more detail below, the embodiments of the present invention cause the total Q factor during the recovery period to be lower than the total Q factor before the recovery period (that is, during the transmission of a pulse from transmitter 40 to probe 28) and after the recovery period (that is, during the reception of a resonance signal by probe 28), by varying the impedance of spectrometer 30. More specifically, the apparatus illustrated in FIG. 3 will be analyzed by discussing the specific electrical configuration of the apparatus during (a) transmission of a pulse by transmitter 40 to probe 28, (b) the recovery period, and (c) reception of a resonance signal by probe 28. In addition, the recovery period will be analyzed as having a first portion, a second portion and a third portion.

1. Transmission of a Pulse by Transmitter 40 to Probe 28

Referring again to FIG. 3, an RF magnetic field must be generated at a target specimen (not illustrated). The target specimen is typically placed near, or inside coil 36. For example, if the apparatus is to be used for detecting a target specimen which may be inside a suitcase, coil 36 should be large enough to allow a suitcase (with the target specimen contained therein) to be placed inside coil 36.

Transmitter 40 generates a pulse and provides the pulse to probe 28. The pulse is at a relatively high power, typically several hundred watts. This relatively high power causes all diodes (that is, diodes 52, 54, 60, and 62) to turn ON. As a result, the power output by transmitter 40 will cause diodes 60 to connect connection point 59 to ground, thereby producing a low impedance at connection point 59. λ/4 transmission line 56 will cause the low impedance at connection point 59 to be seen as a high impedance from connection point 31. This high impedance will be in parallel with the 50 Ω output impedance of transmitter 40.

Further, connection point 51 will be connected to ground via diodes 54, thereby resulting in a low impedance at connection point 51. This low impedance at connection point 51 will be transformed by λ/4 transmission line 48 to a high impedance seen from connection point 31. In this case, the total impedance of spectrometer 30 is not significantly different from the 50 Ω output impedance of transmitter 40 by itself. As a result, the impedance of spectrometer 30 matches the impedance of probe 28, the total Q factor remains high, and the transfer of RF power to probe 28 is extremely efficient.

Figure 5:
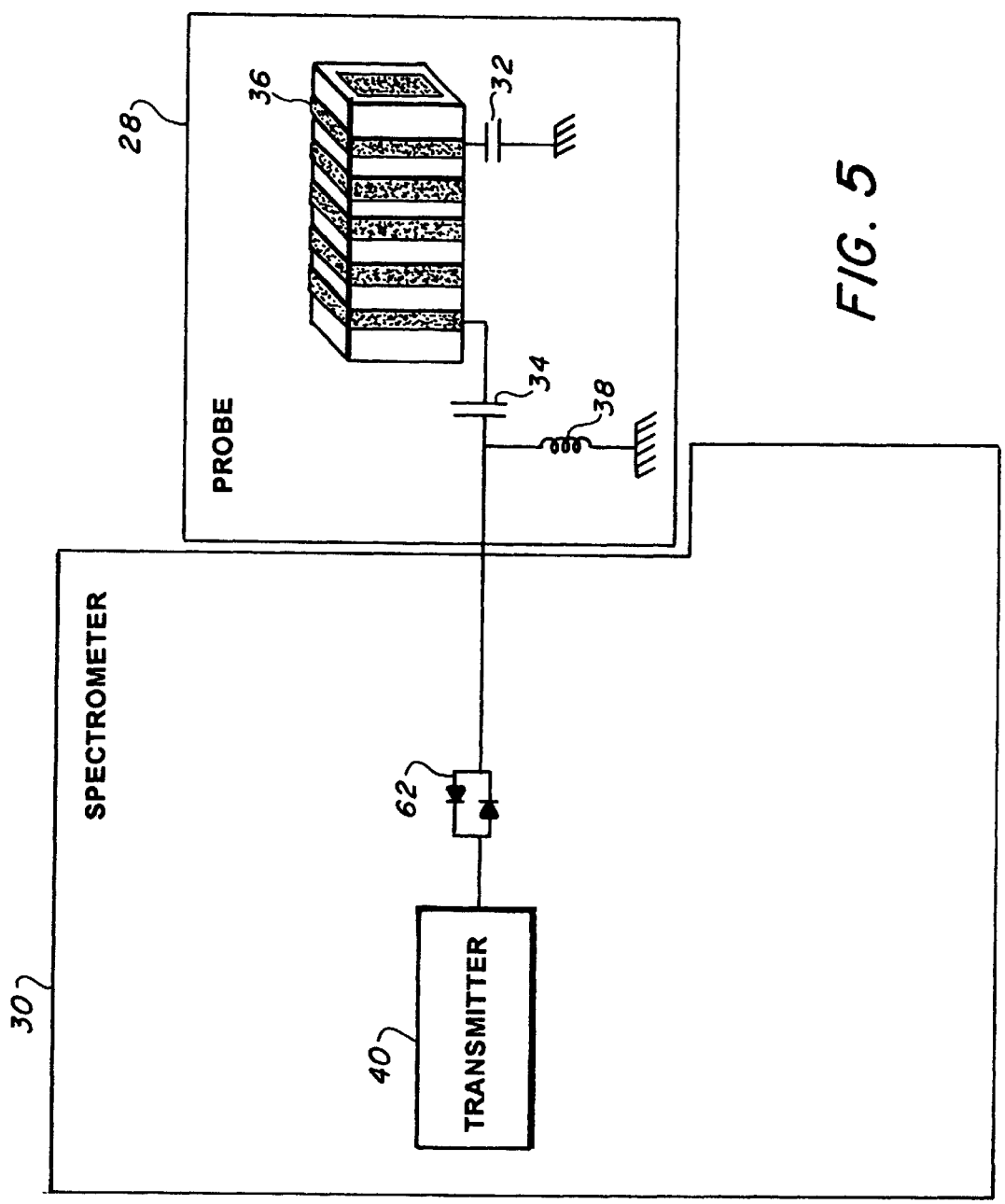
FIG. 5 is a block diagram illustrating the electrical circuit configuration of the apparatus illustrated in FIG. 3, during the transmission of a pulse to a probe by a transmitter and during a first portion of a recovery period, according to an embodiment of the present invention.

Thus, during the transmission of a pulse to probe 28 from transmitter 40, the apparatus illustrated in FIG. 3 will be electrically configured as illustrated in FIG. 5. More specifically, FIG. 5 is a block diagram illustrating the electrical circuit configuration of the apparatus illustrated in FIG. 3, during the transmission of a pulse to probe 28 by transmitter 40, according to an embodiment of the present invention. As illustrated by FIG. 5, when transmitter 40 is transmitting a pulse to probe 28, the power output of transmitter 40 causes T/R switch 44 to connect transmitter 40 to probe 28, while disconnecting receiver 42 from probe 28. Moreover, spectrometer 30 will now be at the matched impedance (approximately 50 Ω) as seen by probe 28. This matched impedance causes the total Q factor of spectrometer 30 and probe 28 to be at a high level. Therefore, during transmission of a pulse from transmitter 40 to probe 28, the impedance of spectrometer 30 is matched to probe 28, thereby causing the total Q factor of spectrometer 30 and probe 28 to be high. This high total Q factor allows probe 28 to efficiently generate an RF field at a specimen.

2. Recovery Period

After the transmitted pulse, probe 28 must "ring down" before probe 28 can effectively receive a resonance signal from a specimen. Therefore, probe 28 must wait for a recovery period to elapse. Transmitter 40 is not providing a pulse to probe 28 at this time, and the voltage at connection point 31 will slowly decrease during the recovery period.

a. First Portion of the Recovery Period

A first portion of the recovery period is defined as the time when transmitter 40 stops providing a pulse to probe 28, until the time when the energy in probe 28 rings down to a point approaching the voltage when Zener diodes 54 stop conducting ($\geqq 15V$). As a result, during the first portion of the recovery period, the apparatus illustrated in FIG. 3 will remain electrically configured as illustrated in FIG. 5 and will maintain a high total Q factor.

b. Second Portion of the Recovery Period

A second portion of the recovery period is defined as the time when Zener diodes 54 stop conducting (turn OFF), while diodes 52, 60, and 62 remain ON. Generally, diodes 52, 60, and 62 remain ON as long the voltage at connection point 31 is above approximately 0.7 V. More specifically, when the voltage at connection point 31 decreases below approximately 15V, diodes 54 turn OFF, thereby disconnecting connection point 51 from ground. Moreover, diodes 52 remain ON. At this moment, λ/2 transmission line 46 is terminated by diodes 52. λ/2 transmission line 46 transforms the small impedance of diodes 52 to a low impedance at connection point 31, in parallel with the 50 Ω output impedance of transmitter 40. Moreover, diodes 60 continue to remain ON, thereby connecting λ/4 transmission line 56 to ground at connection point 59, and producing a high impedance as seen from connection point 31 through λ/4 transmission line 56. Therefore, the total impedance of spectrometer 30 will be at a relatively low level.

Figure 6:
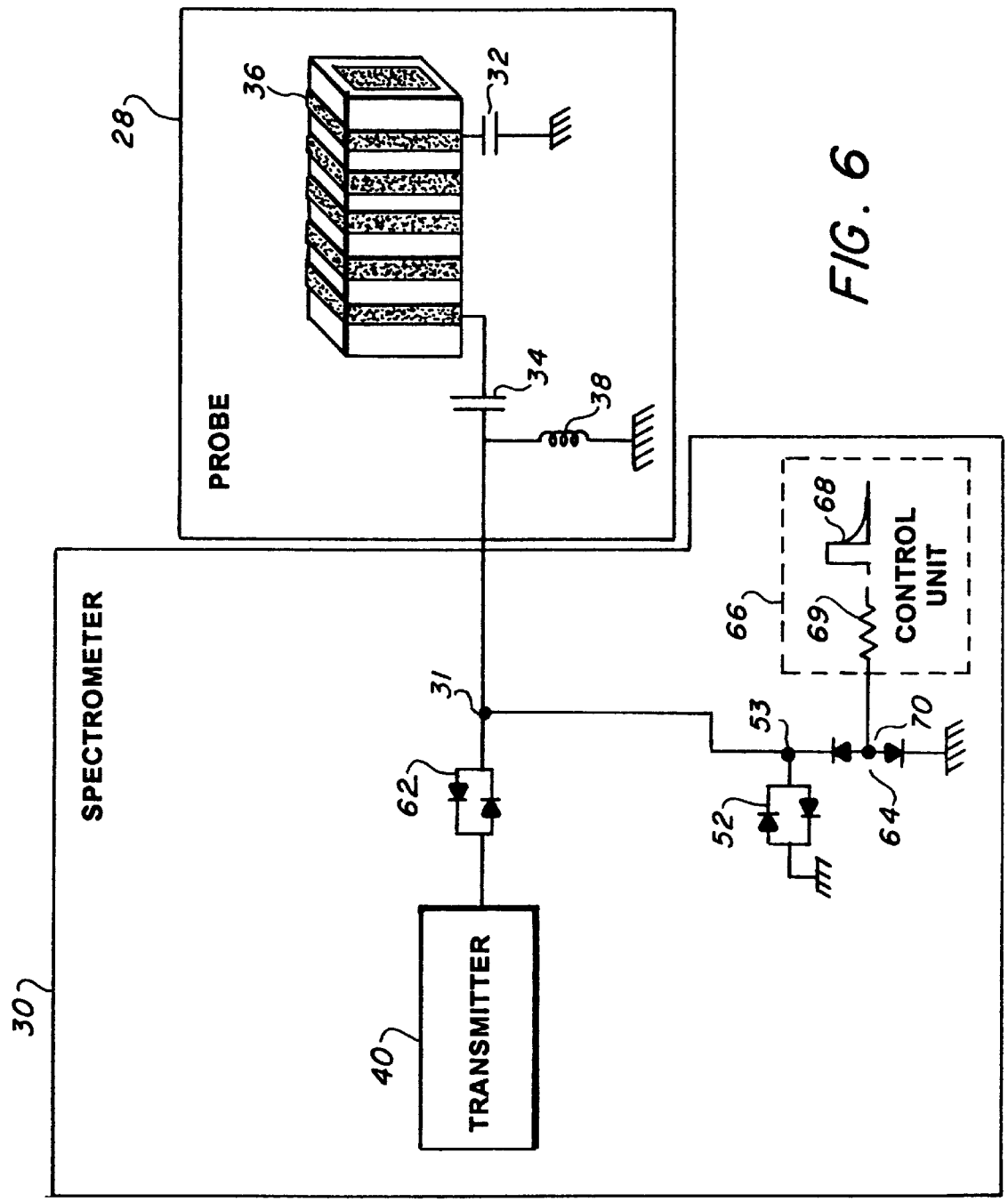
FIG. 6 is a block diagram illustrating the electrical configuration of the apparatus illustrated in FIG. 3, during a second portion of the recovery period, according to an embodiment of the present invention.

Therefore, during the second portion of the recovery period, the apparatus illustrated in FIG. 3 will be electrically configured as illustrated in FIG. 6. More specifically, FIG. 6 is a block diagram illustrating the electrical configuration of the apparatus illustrated in FIG. 3, during the second portion of the recovery period, according to an embodiment of the present invention. As illustrated in FIG. 6, transmitter 40 is still connected to probe 28, and receiver 42 is disconnected from probe 28. However, as compared to FIG. 5, control unit 66 is connected to λ/2 transmission line 46 and supplies control signal 68 to connection point 70. At this time, control signal 68 is high. Moreover, the impedance of spectrometer 30 is relatively low, thereby causing the total Q factor of spectrometer 30 and probe 28 to be low. This low total Q factor reduces the recovery period of probe 28 during the second portion of the recovery period.

c. Third Portion of the Recovery Period

Referring again to FIG. 3, after the second portion of the recovery period, the voltage at connection point 31 eventually decreases below 0.7V, thereby defining a third portion of the recovery period. More specifically, during the third portion of the recover period, diodes 60 will turn OFF, thereby disconnecting λ/4 transmission line 56 from ground and connecting preamplifier 58 to probe 28. Moreover, diodes 62 will turn OFF, thereby disconting transmitter 40 from probe 28. The control signal generated by control unit 66 remains high, and is preferably at least 2V to maintain diodes 64 to be ON. Therefore, connection point 53 will be connected to ground via diodes 64, thereby producing a low impedance at the end of λ/2 transmission line 46. This low impedance at an end of λ/2 transmission line 46 will be seen as a low impedance from connection point 31, and will be substantially below the 50 Ω input impedance of receiver 42. As a result, during the third portion of the recover period, the apparatus illustrated in FIG. 3 will be electrically configured as illustrated in FIG. 7.

Figure 7:
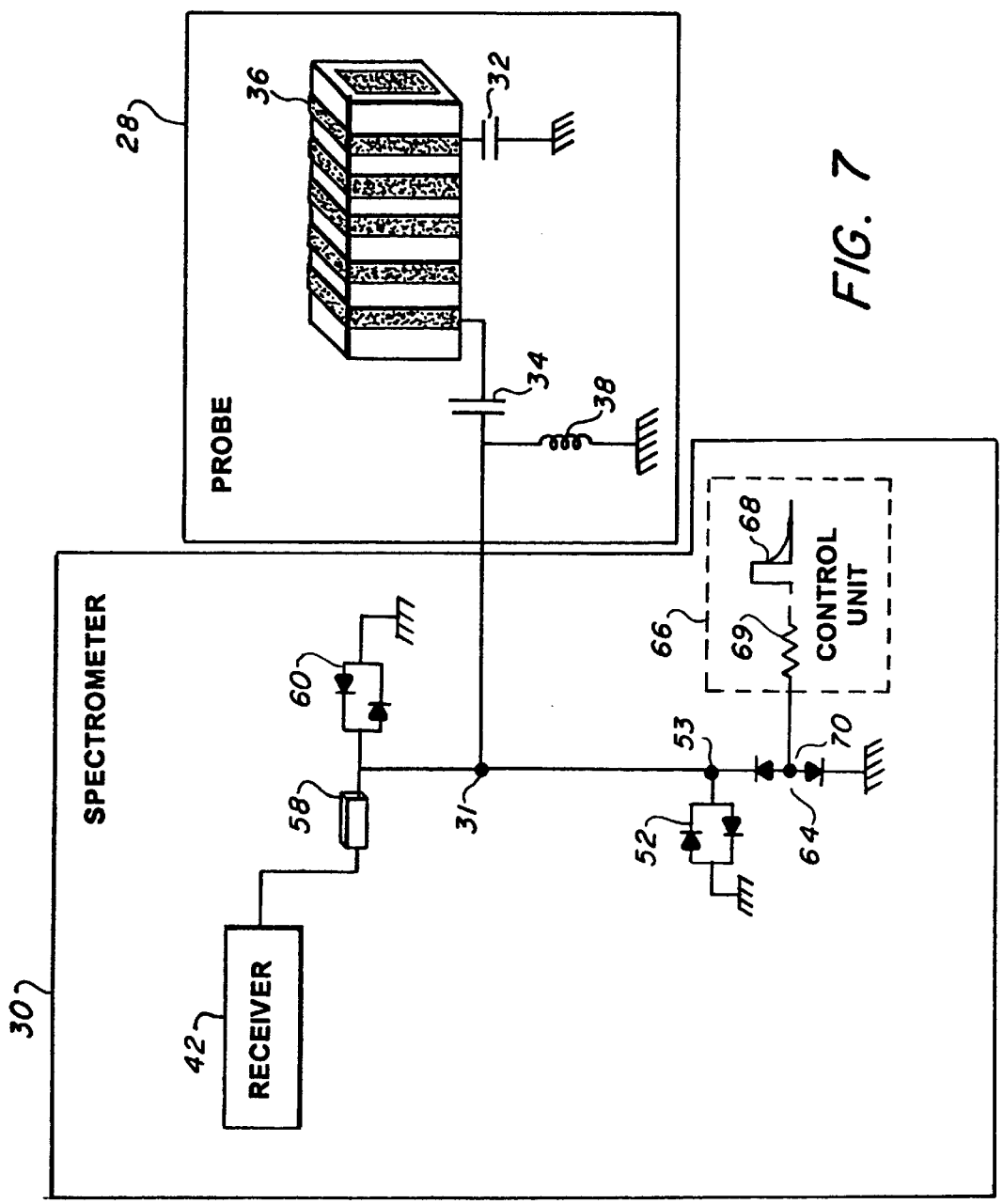
FIG. 7 is a block diagram illustrating the electrical configuration of the apparatus illustrated in FIG. 3, during a third portion of the recovery period, according to an embodiment of the present invention.

More specifically, FIG. 7 is a block diagram illustrating the electrical configuration of the apparatus illustrated in FIG. 3, during the third portion of the recovery period, according to an embodiment of the present invention. Referring now to FIG. 7, the system is still in the recovery period, but is approaching the end of the recovery period. Receiver 42 is connected to probe 28, while transmitter 40 remains disconnected from probe 28. The impedance at connection point 31 as seen through λ/2 transmission line 46 is very low, since control signal 68 maintains diodes 52 and 64 ON. Therefore, the impedance of spectrometer 30 will be low, thereby causing the total Q factor of spectrometer 30 and probe 28 to be low. This low total Q factor continues to actively dampen probe 28 during the third portion of the recovery period.

The optimal impedance mismatch between probe 28 and spectrometer 30 during the recovery period largely depends on the Q factor of coil 36. Generally, a higher Q factor of coil 36 requires a larger mismatch. As an example, an optimal spectrometer impedance would be approximately 3 Ω for a Q factor of approximately 100 of coil 36. Such selection of an optimal spectrometer impedance is easily determinable by a person of skill in the art, based on the specific electrical configuration and the desired operating frequencies. As a result of the proper selection of output impedance 69, while control signal 68 is high (or ON), probe 28 is coupled to a resistance which minimizes the Q factor and the recovery period. Therefore, the system is maintained in a low Q factor state by control signal 68 until virtually all of the RF energy stored in coil 36 has been dissipated.

As previously described, λ/4 transmission lines 48 and 50 are high-pass filter sections tuned to the frequency of interest. Therefore, λ/4 transmission lines 48 and 50 prevent the relatively low-level voltage of control signal 68 from reaching probe 28.

3. Reception of a Resonance Signal by Probe 28

Figure 8:
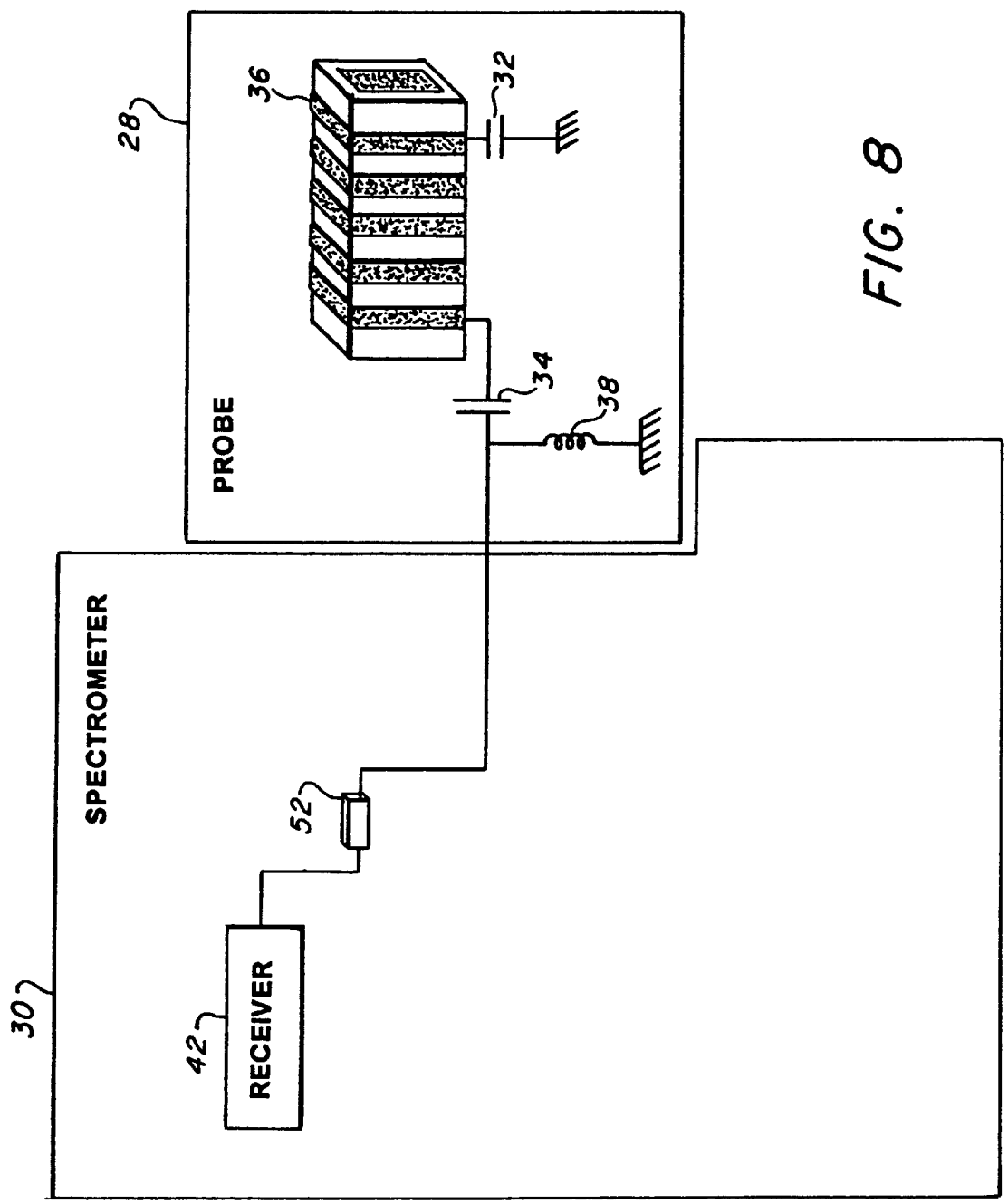
FIG. 8 is a block diagram illustrating the electrical circuit configuration of the apparatus illustrated in FIG. 3, during the reception of a resonance signal by the receiver, according to an embodiment of the present invention.

Referring again to FIG. 3, to end the recovery period and allow receiver 42 to receive a signal from probe 28, control signal 68 produced by control unit 66 is switched low or OFF. As a result, the apparatus illustrated in FIG. 3 will be electrically configured as illustrated in FIG. 8. The switching off occurs slowly, through an RC network, to eliminate transients.

More specifically, FIG. 8 is a block diagram illustrating the electrical circuit configuration of the apparatus illustrated in FIG. 3, during the reception of a resonant signal by probe 28 after the recover period, according to an embodiment of the present invention. Referring now to FIG. 8, receiver 42 is connected to probe 28, while transmitter 40 is disconnected from probe 28. The switching of control signal 68 to a low level causes diodes 52 and 64 to turn OFF, thereby producing a high impedance at the end of λ/2 transmission line 46 at connection point 53. This high impedance at connection point 53 is seen as a high impedance from connection point 31 through λ/2 transmission line 46, and is in parallel with the 50 Ω input impedance of receiver 22. Therefore, the total impedance of spectrometer 30 is not significantly different from the 50 Ω input impedance of receiver 22 by itself, and the total impedance of spectrometer 30 approximately matches the impedance of probe 28. As a result, the total Q factor is high and the transfer of a signal from probe 28 to receiver 42 is extremely efficient. As can be seen from FIGS. 5 and 8, switching spectrometer 30 to a high impedance before and after the recovery period effectively removes active damping circuit 79 from probe 28 during transmission and reception.

FIGS. 9(A), 9(B), 9(C), and 9(D) are diagrams illustrating, respectively, the timing of a pulse 86 generated by transmitter 40, a control signal 68 generated by control unit 66, the total Q factor 90 of spectrometer 30 in combination with probe 28, and the RF energy 92 in coil 38 of probe 28. FIGS. 9(A), 9(B), 9(C), and 9(D), not drawn to scale, are included to further illustrate the general operation of the above embodiments of the present invention.

As illustrated in FIG. 9(A), a pulse 86 is generated by transmitter 40 and is formed, generally, by keying an RF signal 87 ON and OFF. While pulse 86 is being supplied to probe 28 from time $t_1$ to time $t_2$, control signal 68 generated by control unit 66 is maintained high (H). Therefore, during the transmission of a pulse from transmitter 40 to probe 28, the total Q factor will be high (H), as illustrated in FIG. 9(C). At the end of pulse 86 at time $t_2$, control signal 68 remains high (H), to thereby start the recovery period. During the recovery period, total Q factor 90 will eventually change to a low level (L), as illustrated in FIG. 9(C). Then, as control signal 68 is switched to a low level (L) to end the recovery period, total Q factor 90 will be changed back to a high level (H) for the reception of a resonance signal from a specimen.

FIG. 9(D) illustrates RF energy 92 in coil 36 of probe 28. As illustrated in FIG. 9(D), RF energy 92 rapidly decreases during the recovery period, and is virtually eliminated when control signal 68 is switched to the low level (L).

Therefore, spectrometer 30 functions as a variable impedance load which is connected to probe 28. Spectrometer 30 causes the total Q factor during the recovery period to be lower than the total Q factor before and after the recovery period, by varying the impedance of spectrometer 30. For example, in FIG. 5, with transmitter 40 connected to probe 28 for the transmission of a pulse to probe 28, the impedance of spectrometer 30 is matched. This matched impedance causes the total Q factor of spectrometer 30 and probe 28 to be high during the transmission of a pulse from transmitter 40 to probe 28. Then, during the recovery period as illustrated in FIGS. 6 and 7, the impedance of spectrometer 30 will be low, thereby causing the total Q factor of spectrometer 30 and probe 28 during the recovery period to be low. This low total Q factor causes the probe to be actively damped, thereby reducing the recovery period. To end the recovery period, control signal 68 produced by control unit 66 is switched low, and the apparatus is electrically configured as illustrated in FIG. 8, where receiver 42 can now receive signals from probe 28. Moreover, in FIG. 8, the impedance of spectrometer 30 will be matched to probe 28, thereby causing the total Q factor of spectrometer 30 and probe 28 to be high. This high total Q factor allows probe 28 to efficiently receive signals from a specimen.

More specifically, spectrometer 30 causes the total Q factor of spectrometer 30 and probe 28 during the recovery period to be lower than the total Q factor before and after the recovery period by varying the impedance of spectrometer 30, without changing the electrical configuration of probe 28 and without introducing additional noise into the circuitry. In other words, probe 28 does not include elements that are switched to vary the electrical configuration of probe 28. Thus, probe 28 has a fixed electrical configuration which is not changed to vary the total Q factor. Probe 28 can be considered to be a stand-alone probe which can operate independently of spectrometer 30, or with different loads attached thereto. Therefore, spectrometer 30 is a totally separate element from probe 28.

Moreover, a probe is not intended to be limited to the specific elements shown in probe 28. There are many possible probe designs. The particulars of the active damping circuit described herein are appropriate to a series-tuned probe. Adapting this description to parallel-tuned probes is straightforward. The major change is that high impedances induce active damping in parallel-tuned circuits. Also, the use of discrete (lumped) elements is generally more appropriate at low RF frequencies than are transmission lines, as is well-known in the art.

According to the above embodiments of the present invention, a spectrometer has an impedance that is matched to the probe 28, and hence produces a high total Q factor, during generation of an RF magnetic field at a target specimen and during reception of a resonance signal. A control signal is used to switch a spectrometer between the matched impedance state and a low-impedance state, which in turn switches the total Q factor state from high to low during the recovery period, thereby reducing the recovery period. After the recovery period, the spectrometer is switched to the matched impedance state to switch the total circuitry of the spectrometer and the probe to a high total Q factor state for reception of resonance signals.

By reducing the recovery period, the above embodiments of the present invention increase the sensitivity and lower the limits of signal detection. As a result, previously undetectable substances may be detectable by NQR or NMR. In addition, the relatively rapid recovery period of a probe will permit a substantial decrease in the time interval between RF pulses, thereby providing much more flexibility in the choice of experimental parameters and improving the bandwidth in stochastic methods of detection.

According to the above embodiments of the present invention, active damping circuitry (such as active damping circuit 79) solves problems associated with a conventionally required compromise between the sensitivity (that is, the desire for a high Q coil) and recovery period (that this, the requirement for a long enough recovery period to effectively dissipate energy in the coil). First, according to the above embodiments of the present invention, during a high power transmit period, the transmitter output biases diodes which maintain a high Q-factor state. This obviates the need for additional power supplies required in commercial Q-switching devices.

Moreover, unlike conventional active damping methods, the above embodiments of the present invention do not require the active damping circuitry (such as active damping circuit 79) to be part of the probe or the receiver. More specifically, the active damping circuitry operates outside of the probe. As a result, the probe does not have to be redesigned to incorporate the active damping circuitry, and the active damping circuitry may be attached to any existing series resonant probe without modifying the probe or the active damping circuitry, other than retuning the λ/4 lines to the appropriate frequency. For parallel resonant circuits, the embodiment of the present invention as illustrated in FIG. 3 can be slightly modified to place a required high impedance in series between probe 28 and receiver 42.

In addition, the above embodiments of the present invention do not require resistive elements in the active damping circuitry during reception. For example, as illustrated by FIG. 8, active damping circuit 79 does not introduce resistive elements during reception. As a result, there is no reduction in sensitivity. Moreover, the active damping circuitry filters switching transients from the probe and receiver. These switching transients would otherwise cause ringing associated with the turning off of active damping circuitry.

An apparatus as illustrated in FIG. 3 was tested and provided the following measurements. During the test, the impedance presented by active damping circuit 79 was approximately 2.7 kΩ during transmission of a pulse from probe 28, 3 Ω during the recovery period, and 1.3 kΩ during signal reception. For a test probe with an unloaded Q of 200, operating at 1.04 MHz, the recovery period was reduced from 700 µs to 320 µs with no measurable increase in the noise.

The above embodiments of the present invention are described as relating to a transmitter which produces a pulse, or a train of pulses. The formation of a pulse, or a train of pulses, for use in NQR and NMR is well-known, and many different types of pulses can be created. Thus, the above embodiments of the present invention are not intended to be limited to use with any specific type of pulse or pulses.

Various levels are described herein as being "high" or "low". "High" and "low" are relative terms, and can be two discrete levels, as illustrated, for example, in FIG. 9(C). However, it is not intended for the different levels of the total Q factor, or the different levels of the control signal, to be limited to two discrete levels. For example, "high" can refer to a first range for the total Q factor, and "low" can refer to a second range for the total Q factor, where the second range represents lower values than the first range. Similarly, a control signal is described as being switched to a high and a low level; however, it is not intended for the control signal to be limited to being switched to two different discrete levels. Moreover, various values for "high" and "low" can easily be determined by a person of skill in the art, based on the specific electrical configuration, the required frequencies, and other application specific requirements.

Similarly, a "matched" impedance of spectrometer 30 is described as being approximately 50 Ω, and a "low" impedance of spectrometer 30 is described as being approximately 3 Ω. These values are typical values; however, the present invention is not intended to be limited to such values. Instead, various impedance levels can be easily determined by a person of skill in the art, based on the specific electrical configuration, the required frequencies, and other application specific requirements.

According to the above embodiments of the present invention, control signal 68 is approximately 2V when high, and is preferably driven by the same TTL line which drives a pulse produced by transmitter 40. This TTL signal is used to trigger a monostable multivibrator, the output of which is a pulse of controllable duration. The output pulse passes through an RC network which allows the slope of the falling edge of the pulse to be adjusted. This eliminates the possibility of high-frequency switching transients reaching the active damping circuitry or the probe. The above embodiment are applicable to a wide range of NMR and NQR applications. For example, NQR is a known technique for detecting specific substances in a target specimen, wherein the specific substances include sub-kilogram quantities of narcotics and explosives having quadrupolar nuclei, such as nitrogenous or chlorine-containing explosives and narcotics. The above-embodiments of the present invention are applicable to such NQR techniques as disclosed, for example, in U.S. Pat. No. 5,206,592, issued Apr. 27, 1993, to Buess, et al. for DETECTION OF EXPLOSIVES BY NUCLEAR QUADRUPOLE RESONANCE; U.S. Pat. No. 5,233,300, issued Aug. 3, 1993, to Buess, et al. for DETECTION OF EXPLOSIVES AND NARCOTICS BY LOW POWER LARGE SAMPLE VOLUME NUCLEAR QUADRUPOLE RESONANCE; and U.S. Pat. No. 5,365,171, issued Nov. 15, 1994, for REMOVING THE EFFECTS OF ACOUSTIC RINGING AND REDUCING TEMPERATURE EFFECTS IN THE DETECTION OF EXPLOSIVES BY NQR, each of which is incorporated by reference herein, in its entirety, for all purposes. Moreover, the present invention is especially applicable to pulsed NQR and low frequency NMR detection systems.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus comprising:
a probe for generating an RF magnetic field at a specimen which causes the specimen to produce a resonance signal and, after a recovery period from emitting the signal, receiving the resonance signal produced by the specimen; and
a spectrometer presenting a variable impedance load to the probe and having a total Q factor therewith, the spectrometer causing the total Q factor during the recovery period to be lower than the total Q factor before and after the recovery period by varying the impedance, without changing the electrical configuration of the probe;
wherein the spectrometer comprises:
a transmitter generating a pulse, for transmission to said probe;
wherein the probe produces an output signal corresponding to the received resonance signal, and the spectrometer further comprises:

a receiver receiving and analyzing the output signal of the probe;

further comprising:

a transmit/receive switch which, to generate an RF magnetic field from the probe, connects the transmitter to the probe while disconnecting the receiver from the probe, and, to receive a resonance signal produced by a specimen, connects the receiver to the probe while disconnecting the transmitter from the probe;

wherein the spectrometer further comprises:

a control unit producing a control signal which is controllable to vary the recovery period.

2. An apparatus comprising:

a probe for generating an RF magnetic field at a specimen which causes the specimen to produce a resonance signal and, after a recovery period from emitting the signal, receiving the resonance signal produced by the specimen; and a spectrometer presenting a variable impedance load to the probe and having a total Q factor therewith, the spectrometer causing the total Q factor during the recovery period to be lower than the total Q factor before and after the recovery period by varying the impedance, without changing the electrical configuration of the probe;

wherein the spectrometer comprises:

a transmitter generating a pulse, for transmission to said probe;

wherein the probe produces an output signal corresponding to the received resonance signal, and the sectrometer further comprises:

a receiver receiving and analyzing the output signal of the probe;

further comprising:

a transmit/receive switch which, to generate an RF magnetic field from the probe, connects the transmitter to the probe while disconnecting the receiver from the probe, and, to receive a resonance signal produced by a specimen, connects the receiver to the probe while disconnecting the transmitter from the probe;

wherein the probe is a series-tuned resonant circuit.

3. An apparatus as in claim 2, wherein spectrometer further comprises:

a transmission line connected in parallel with the probe, the transmission line being connected in parallel with the transmitter when the transmitter is connected to the probe via the transmit/receive switch, and being connected in parallel with the receiver when the receiver is connected to the probe via the transmit/receive switch, the control signal of the control unit controlling the impedance seen by the probe through the transmission line.

4. An apparatus as in claim 3, wherein the transmission line includes a first quarter-wave transmission line having a first end and a second end, the first end connected to the transmit/receive switch, a second quarter-wave transmission line having a first end and a second end, the first end of the second quarter-wave transmission line connected to the second end of the first quarter-wave transmission line at a connection point, and first diodes connecting the connection point to ground, and second diodes connecting the second end of the second quarter-wave transmission line to ground.

5. An apparatus as in claim 4, wherein the control signal produced by the control unit is provided to the second end of the second quarter-wave transmission line.

6. An apparatus comprising:

a probe for generating an RF magnetic field at a specimen which causes the specimen to produce a resonance signal and, after a recovery period from emitting the signal, receiving the resonance signal produced by the specimen; and a spectrometer presenting a variable impedance load to the probe and having a total Q factor therewith, the spectrometer causing the total Q factor during the recovery period to be lower than the total Q factor before and after the recovery period by varying the impedance, without changing the electrical configuration of the probe;

wherein the spectrometer comprises:

a transmitter generating a pulse, for transmission to said probe;

wherein the probe produces an output signal corresponding to the received resonance signal, and the spectrometer further comprises:

a receiver receiving and analyzing the output signal of the probe;

further comprising:

a transmit/receive switch which, to generate an RF magnetic field from the probe, connects the transmitter to the probe while disconnecting the receiver from the probe, and, to receive a resonance signal produced by a specimen, connects the receiver to the probe while disconnecting the transmitter from the probe;

wherein the probe is a parallel-tuned resonant circuit.

7. An apparatus as in claim 6, wherein said spectrometer presents a high impedance load to said probe during the recovery period.

8. An apparatus comprising:

a probe generating an RF magnetic field at a specimen which causes the specimen to produce a resonance signal and, after a recovery period from emitting the signal, receiving the resonance signal produced by the specimen; and a variable impedance spectrometer connected to the probe and having a total Q factor therewith, the impedance of the spectrometer being variable, without changing the electrical configuration of the probe, to cause the total Q factor to be at a first level while the probe generates a field, cause the total Q factor to be at a second level during the recovery period, and cause the total Q factor to return to the first level while the probe receives the resonance signal, wherein the second level represents a lower total Q factor than the first level.

9. An apparatus as in claim 8, wherein the spectrometer comprises:

a transmitter generating a pulse, the probe receiving the pulse and generating the RF magnetic field in accordance with the received pulse.

10. An apparatus as in claim 9, wherein the probe produces an output signal corresponding to the received resonance signal, and the spectrometer further comprises:

a receiver receiving and analyzing the output signal of the probe.

11. An apparatus as in claim 10, further comprising:

a transmit/receive switch which, to transmit a signal to the probe, connects the transmitter to the probe while disconnecting the receiver from the probe, and, to receive a resonance signal produced by a specimen, connects the receiver to the probe while disconnecting the transmitter from the probe.

12. An apparatus as in claim 11, wherein the spectrometer further comprises:

a control unit producing a control signal which is controllable to end the recovery period and allow the transmit/receive switch to connect the receiver to the probe.

13. An apparatus as in claim 12, wherein the spectrometer further comprises:

a transmission line connected in parallel with the probe, the transmission line being connected in parallel with the transmitter when the transmitter is connected to the probe via the transmit/receive switch, and being connected in parallel with the receiver when the receiver is connected to the probe via the transmit/receive switch, the control signal of the control unit controlling the impedance seen by the probe through the transmission line.

\* \* \* \* \*

UNITED STATES PATENT AND TRADEMARK OFFICE
CERTIFICATE OF CORRECTION

PATENT NO. : 6,242,918 B1  Page 1 of 1
DATED : June 5, 2001
INVENTOR(S) : Joel B. Miller et al.

It is certified that error appears in the above-identified patent and that said Letters Patent is hereby corrected as shown below:

<u>Title page,</u>
Item [75], add the following to the list of inventors:
-- Allen N. Garroway, Fort Washington, MD (US) --

Signed and Sealed this

Twenty-ninth Day of July, 2003

JAMES E. ROGAN
*Director of the United States Patent and Trademark Office*